(12) United States Patent
Trent et al.

(10) Patent No.: US 9,349,447 B1
(45) Date of Patent: May 24, 2016

(54) CONTROLLING COUPLING IN LARGE CROSS-POINT MEMORY ARRAYS

(71) Applicant: HGST, Inc., San Jose, CA (US)

(72) Inventors: Thomas Trent, Nashua, NH (US); Ward Parkinson, Boise, ID (US)

(73) Assignee: HGST, INC., San Jose, CA (US)

( * ) Notice: Subject to any disclaimer, the term of this patent is extended or adjusted under 35 U.S.C. 154(b) by 0 days.

(21) Appl. No.: 14/635,532

(22) Filed: Mar. 2, 2015

(51) Int. Cl.
*G11C 11/00* (2006.01)
*G11C 13/00* (2006.01)

(52) U.S. Cl.
CPC .................... *G11C 13/0021* (2013.01)

(58) Field of Classification Search
USPC ........................................... 365/148
See application file for complete search history.

(56) References Cited

U.S. PATENT DOCUMENTS

| | | | | |
|---|---|---|---|---|
| 6,751,126 B2* | 6/2004 | Kim | ....................... | G11C 16/30 365/185.18 |
| 7,196,943 B2* | 3/2007 | Mirichigni | ............. | G11C 16/24 365/185.18 |
| 2003/0223272 A1* | 12/2003 | Mihnea | .................. | G11C 16/08 365/185.29 |
| 2013/0286754 A1* | 10/2013 | Jung | ....................... | G11C 8/08 365/189.06 |

* cited by examiner

*Primary Examiner* — Hoai V Ho
*Assistant Examiner* — Pablo Huerta
(74) *Attorney, Agent, or Firm* — Patterson & Sheridan, LLP

(57) ABSTRACT

In various embodiments, quench switches are utilized within a cross-point memory array to minimize parasitic coupling in lines proximate selected lines.

15 Claims, 2 Drawing Sheets

CONTROLLING COUPLING IN LARGE CROSS-POINT MEMORY ARRAYS

TECHNICAL FIELD

The present invention relates to the design and operation of cross-point memory arrays, and more particularly to methods for controlling coupling between wordlines or bitlines within such arrays.

BACKGROUND

There is growing demand for memory devices having ever-greater capacity. A measure related to capacity is array efficiency; array efficiency is the ratio of actual memory circuitry (e.g., the area encompassing the wordlines and bitlines and storage elements) to the overall area of the memory device. A memory device having an 80% array efficiency, for example, would have 80% of its area covered by memory array circuitry as opposed to the peripheral supporting circuitry. High-capacity memory devices are sometimes broken down into a plurality of cross-point memory arrays or tiles. For highest capacity, these tiles are typically fabricated using very fine geometries. Each tile will typically require driver circuitry to control the voltages into the array of that tile. However, the driver logic for supporting tile operation reduces array efficiency. It is therefore preferable in many implementations to design a memory device with fewer large tiles instead of many small tiles, because fewer large tiles will require fewer instances of the supporting driver circuits and will, therefore, have greater array efficiency. However, with large tiles come other problems such as coupling between wordlines or bitlines within the array.

SUMMARY

Embodiments of the present invention relate to the design and operation of cross-point memory arrays, and more particularly to methods for controlling coupling between wordlines or bitlines. Specifically, voltages on wordlines or bitlines adjacent to (i.e., immediately neighboring in an array) a selected wordline or bitline are controlled to minimize or substantially prevent such coupling. As used herein, "wordlines" and "bitlines" do not imply any particular directionality within a memory array; thus, wordlines may correspond to conductive lines propagating either "horizontally" or "vertically" within a particular memory, with the bitlines being the lines intersecting those wordlines.

Embodiments of the present invention are applicable to memory devices having cross-point arrays featuring memory cells having multiple storage bits per cell—including cells having one to eight bits per cell or more, arrays in a single layer or that are stacked three dimensionally, arrays having select devices based on diodes, semiconductor-controlled rectifiers (SCRs), ovonic threshold switches, bipolar (e.g., PNP or NPN) or field-effect (e.g., NMOS or PMOS) transistors, and arrays featuring memory cells based on phase-change material (e.g., PRAM), on resistive-change material (in which the resistance of a material or layer changes due to molecular structure or due to conductive atoms migrating or growing or moving into or out-of that material, e.g., resistive random-access memory or RRAM), on magnetic field alignment (e.g., magnetic RAM or MRAM), on mechanical switching (such as carbon nanotube filaments that are electrostatically moved to open or close a conductive path), and on other memory cells based on other information storage technologies.

In an aspect, embodiments of the invention feature a method of selecting a memory cell location within a cross-point memory array. The memory array includes or consists essentially of a plurality of wordlines intersecting a plurality of bitlines, and each memory cell location is disposed proximate (or even at) a point of intersection between a wordline and a bitline. Each wordline is electrically coupled to a driver device and a quench switch for minimizing parasitic coupling with adjacent wordlines. A first wordline, which is disposed between a second wordline and a third wordline, is selected. The second and third wordlines may be the wordlines immediately neighboring (on either side) the first wordline. The quench switches electrically coupled to the second wordline and the third wordline are activated, thereby reducing parasitic coupling within the second and third wordlines resulting from selection of the first wordline. A first bitline is selected, thereby selecting the memory cell disposed at the point of intersection between the first wordline and the first bitline.

Embodiments of the invention may include one or more of the following in any of a variety of different combinations. Selecting the first wordline may include or consist essentially of applying a first voltage thereto. Activating the quench switches electrically coupled to the second and third wordlines may include or consist essentially of electrically connecting the second and third wordlines to a second voltage through the quench switches. The first voltage may be a positive voltage, and the second voltage may be a ground voltage. The first voltage may be a ground voltage, and the second voltage may be a positive voltage. At least one (e.g., all) of the quench switches may include or consist essentially of a diode and/or a transistor (and/or another current-steering device). The plurality of wordlines may include or consist essentially of a plurality of odd wordlines interleaved with a plurality of even wordlines. The quench switches of the odd wordlines may be electrically connected together, and/or the quench switches of the even wordlines may be electrically connected together.

The plurality of wordlines may include or consist essentially of a plurality of odd wordlines interleaved with a plurality of even wordlines. A first plurality of odd wordlines may include or consist essentially of every other odd wordline. A second plurality of odd wordlines may include or consist essentially of the odd wordlines not within the first plurality of odd wordlines (i.e., every other odd wordline not within the first plurality of odd wordlines) A first plurality of even wordlines may include or consist essentially of every other even wordline. A second plurality of even wordlines may include or consist essentially of the even wordlines not within the first plurality of even wordlines. The quench switches of the first plurality of odd wordlines may be electrically connected together, the quench switches of the second plurality of odd wordlines may be electrically connected together, the quench switches of the first plurality of even wordlines may be electrically connected together, and/or the quench switches of the second plurality of even wordlines may be electrically connected together. If the first wordline is within the first plurality of odd wordlines, the quench switches electrically coupled to the second plurality of odd wordlines may be activated, thereby reducing parasitic coupling within the second plurality of odd wordlines resulting from selection of the first wordline. If the first wordline is within the second plurality of odd wordlines, the quench switches electrically coupled to the first plurality of odd wordlines may be activated, thereby reducing parasitic coupling within the first plurality of odd wordlines resulting from selection of the first wordline. If the first wordline is within the first plurality of even wordlines, the quench switches electrically coupled to the second plurality of even wordlines may be activated, thereby reducing parasitic coupling within the second plurality of even wordlines resulting from selection of the first wordline. If the first wordline is within the second plurality of even wordlines, the quench switches electrically coupled to the first plurality of even wordlines may be activated, thereby reducing parasitic coupling within the first plurality of even wordlines resulting from selection of the first wordline. Selecting the first wordline may include or consist essentially of applying a first voltage thereto. Activating the quench switches electrically coupled to the second and third wordlines may include or consist essentially of electrically connecting the second and third wordlines to a second voltage through the quench switches. Activating the quench switches electrically coupled to the first plurality of odd wordlines, the second plurality of odd wordlines, the first plurality of even wordlines, or the second plurality of even wordlines may include or consist essentially of electrically connecting said wordlines to a third voltage through the quench switches. The second and third voltages may be approximately equal. The first voltage may be different from the second and third voltages. For example, the first voltage may be positive and the second and third voltages may be negative (or ground), or vice versa. Each wordline may include a first end electrically connected to a first quench switch and a second end, opposite the first end, electrically connected to a second quench switch.

In another aspect, embodiments of the invention feature a memory device including or consisting essentially of a plurality of wordlines, a plurality of bitlines intersecting the plurality of wordlines, a plurality of memory cell locations each disposed proximate (or even at) a point of intersection between a wordline and a bitline, a plurality of quench switches, and a plurality of driver devices. Each quench switch and each driver device is electrically connected to a wordline. For example, each driver device may be electrically connected to a wordline through a quench switch, which is thus disposed (electrically) between the wordline and the driver device. When a wordline is selected, activation of the quench switches electrically connected to wordlines proximate the selected wordline reduces or substantially eliminates parasitic coupling within the wordlines proximate the selected wordline.

Embodiments of the invention may include one or more of the following in any of a variety of different combinations. Each quench switch may include or consist essentially of a diode and/or a transistor (and/or another current-steering device). The plurality of wordlines may include or consist essentially of a plurality of odd wordlines interleaved with a plurality of even wordlines. The quench switches of the odd wordlines may be electrically connected together, and/or the quench switches of the even wordlines may be electrically connected together. Each wordline may include a first end electrically connected to a first quench switch and a second end, opposite the first end, electrically connected to a second quench switch. Each wordline may incorporate one or more quench switches at one or both ends of the wordline, and/or one or more quench switches within the wordline (i.e., such that at least one memory cell location is disposed between the quench switch and the driver device).

The plurality of wordlines may include or consist essentially of a plurality of odd wordlines interleaved with a plurality of even wordlines. A first plurality of odd wordlines may include or consist essentially of every other odd wordline. A second plurality of odd wordlines may include or consist essentially of the odd wordlines not within the first plurality of odd wordlines. A first plurality of even wordlines may include or consist essentially of every other even wordline. A second plurality of even wordlines may include or consist essentially of the even wordlines not within the first plurality of even wordlines. The quench switches of the first plurality of odd wordlines may be electrically connected together, the quench switches of the second plurality of odd wordlines may be electrically connected together, the quench switches of the first plurality of even wordlines may be electrically connected together, and/or the quench switches of the second plurality of even wordlines may be electrically connected together.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean ±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
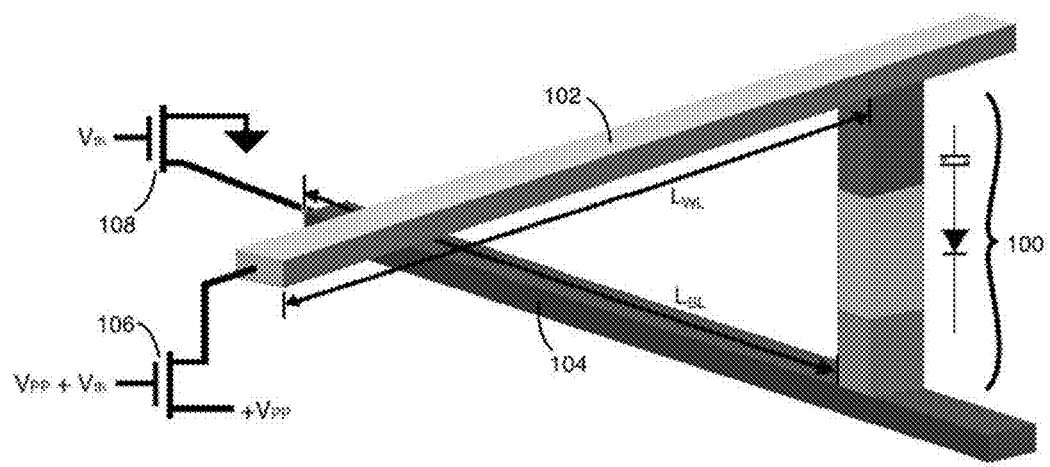
FIG. 1 depicts a vertically constructed memory cell at the point of intersection of a wordline and a bitline in accordance with various embodiments of the invention.

Embodiments of the present invention relate to the design and operation of cross-point memory arrays, and more particularly to methods for controlling coupling between wordlines or bitlines within the array. Wordlines and bitlines are conductive "wires" or pathways that are used to select an individual memory cell. FIG. 1 depicts a memory cell 100 at the intersection of a wordline 102 (having a length $L_{WL}$) and a bitline 104 (having a length $L_{BL}$).

When selecting a memory cell 100, the wordline 102 is driven to a control voltage of $+V_{PP}$ through a MOS drive transistor 106 by applying a voltage to the gate that exceeds the control voltage ($V_{PP}$) by at least the turn-on threshold ($V_{thWL}$) of the MOS transistor 106 (i.e., a gate voltage greater or equal to $V_{PP}+V_{th}$). MOS transistor operation is well known to those skilled in the art. Coincident with the control voltage being applied to the wordline 102, the bitline 104 is pulled to ground through a second drive transistor 108 by applying a voltage to its gate that is equal to or greater than its turn-on threshold voltage ($V_{thBL}$). By turning on these two transistors in this way, a voltage is applied across the memory cell 100 and/or a current flows through the memory cell (depending upon the type of memory cell involved). In actual practice, a cross-point memory array will include a large number of wordlines and bitlines, where the wordlines are parallel to each other and tightly spaced, the bitlines are parallel to each other and tightly spaced, and the wordlines are perpendicular to the bitlines (in FIG. 1, only two lines are depicted—a single wordline and a single bitline). In a state-of-the-art memory array, the widths of the wordlines and bitlines are typically equal to the smallest sized feature that the manufacturing equipment can produce (typically, this is limited by the capability of the photolithography equipment, but other manufacturing techniques are known to those skilled in the art and may be limited by other considerations). The spacing of these wordlines and bitlines is likewise typically equal to the smallest sized feature that the manufacturing equipment can produce, resulting in a periodicity for the wordlines and bitlines equal to twice this minimum producible feature size.

Figure 2:
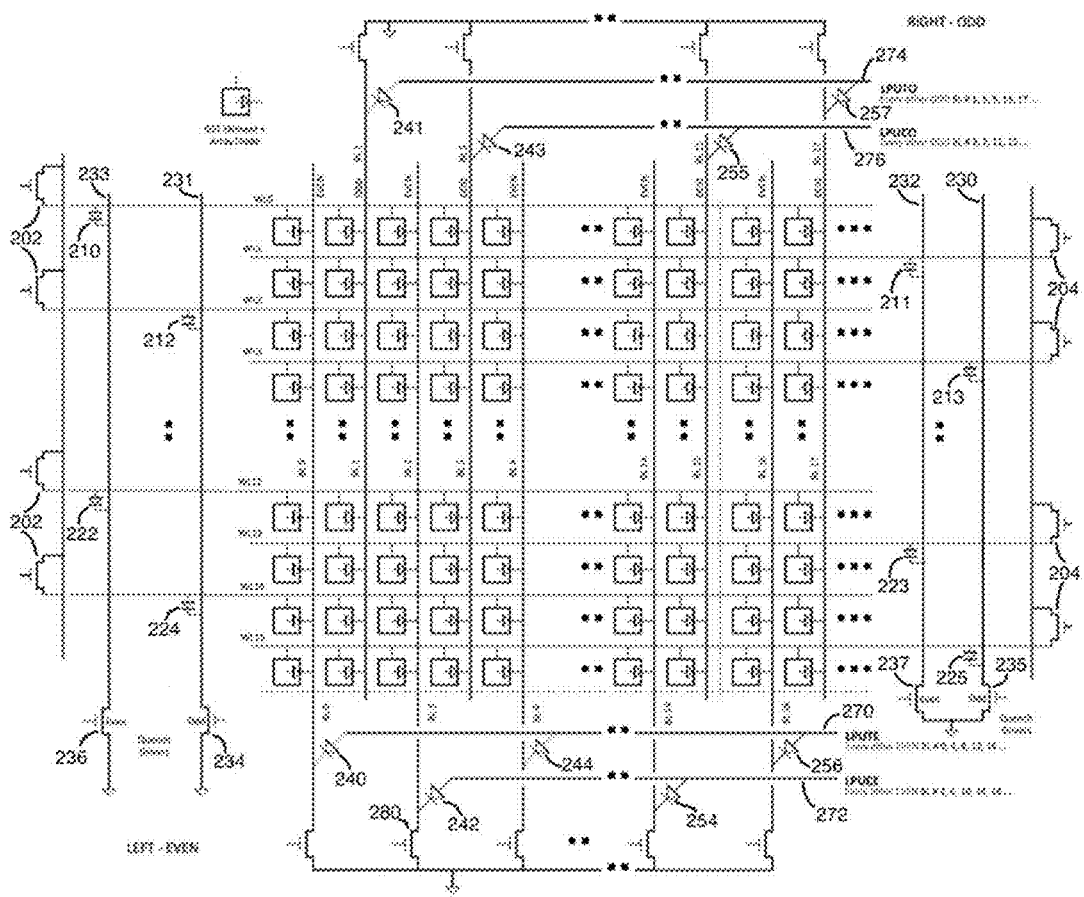
FIG. 2 is a schematic representation of a cross-point memory array in accordance with various embodiments of the invention.

FIG. 2 shows a schematic representation of a cross-point memory array. As shown, a set of closely packed bitlines (BL0-BL17) and an orthogonal set of closely packed wordlines (WL0-WL15) are present in the array. When a memory cell is selected (as described above), a single wordline is pulled to a high voltage and a single bitline is connected to ground. However, when changing the voltage of a single wordline that is surrounded by other wordlines—particularly when surrounded very closely by other wordlines and separated by only a minimal feature sized spacing—there may be a parasitic capacitive coupling effect that will cause the nearby wordlines to be similarly energized (that is to say, their voltages will move in the same direction as the energized wordline). Those skilled in the art will recognize that a similar effect may occur with the bitlines. This parasitic coupling is undesirable because it may have the unintended effect of simultaneously selecting memory cells on those adjacent wordlines. Embodiments of the present invention minimize or substantially eliminate this parasitic coupling by controlling the voltages on these adjacent wordlines and bitlines.

In FIG. 2, the wordlines are drawn horizontally—running from left to right (whereas the bitlines are drawn vertically—running from top to bottom). The wordlines are numbered starting with wordline zero (WL0) at the top of the array and counting downward, and the bitlines are numbered starting with bitline zero (BL0) at the left of the array and counting towards the right. These numbered wordlines are grouped as Even (WL0, WL2, . . . WL12, WL14) and Odd (WL1, WL3, . . . WL13, WL15). Even wordlines exit the array on the left side where they extend to NMOS drivers 202 (depicted in FIG. 1 as NMOS 106) and Odd wordlines exit the array on the right side where they extend to NMOS drivers 204. Extending to alternate sides of the array (as is shown in FIG. 2) is done in physical implementations to better facilitate making physical connections to the individual wordlines; by doing this, the wordlines may be widened due to the extra available space that occurs when the alternating wordlines end at the edge of the array; this wider wordline typically enables an easier and more reliable connection. Connected to the ends of all of the wordlines (while still within the extent of the array) are Quench Switches 210-225. These Quench Switches are typically constructed as Quench Diodes 210-225, but may alternatively include or consist essentially of other current controlling devices such as transistors. In FIG. 2, the Quench Diodes are shown connected to one end of every wordline, but it is contemplated by embodiments of the present invention that Quench Diodes may be included on both ends depending upon the performance characteristics of the array, as described below.

When a single even-numbered wordline is selected (e.g., its voltage is raised), the common wires 230, 231 connecting to the Odd Quench Diodes (212, 213, . . . 224, 225) are connected (e.g., through a switch such as NMOS transistors 234, 235) to ground. In this way, any capacitively induced charge in the adjacent odd-numbered wordlines on either side of the selected wordline will pass through those Odd Quench Diodes to ground, resulting in minimal voltage bounce on those adjacent wordlines. Similarly, when a single odd-numbered wordline is selected (e.g., its voltage is raised), the common wires 232, 233 connecting to the Even Quench Diodes (210, 211, . . . 222, 223) are connected to ground through NMOS switches 236, 237. In this way, any capacitively induced charge in the adjacent even-numbered wordlines on either side of the selected wordline will pass through those Even Quench Diodes to ground, resulting in minimal voltage bounce on those adjacent wordlines.

The voltage bounce on any adjacent wordline must typically be held below the select voltage ($V_{MINSELECT}$) to ensure that no wordline (other than the selected wordline) rises to a voltage that may result in a memory cell selection or that may result in a partially stimulated memory cell (some memory technologies, such as phase-change memory or PCM, may experience cell switching resulting from repeated applications of a voltage below the select voltage but above a partially stimulating, minimum select voltage, $V_{MINSELECT}$).

Depending upon the size of the array and the length of the wordlines and bitlines, Quench Diodes may be placed at both ends of the lines or at one end of the lines. This may be determined by how fast the voltage is desired to be changed when the line is selected. From the laws of capacitor operation, (current through the capacitor is a function of the product of capacitor capacitance and the change in voltage over time, i.e., $C^{dv}/_{dt}$), when the voltage on a selected line changes quickly, the higher frequency component of this changing voltage will typically result in a more significant parasitic coupling to the adjacent lines. To minimize this coupling, putting Quench Diodes on both ends may allow a lower impedance path to ground for the coupled charge. Also, when the lines are long and because the resistance of the lines is not zero, having Quench Diodes at both ends allows for a shorter path for coupled charge induced at the far end of the line (i.e., the end away from the Quench Diodes if such diodes were only at a single end) to be dissipated to ground. By this same logic, it is an aspect of embodiments of the present invention to include one or more additional sets of Quench Diodes within the interior of the array (i.e., at one or more places away from the ends of the lines) for induced charge management in very high speed arrays or very large sized arrays.

Furthermore, depending on the geometry of the array and the switching speed and the amplitude of the drive signal on the selected wordline, a small voltage bounce on the next further out wordlines (i.e., those next to the "adjacent" wordlines adjacent to the selected wordline) may be experienced due to capacitive coupling. While this bounce on the further out wordlines will generally be smaller, it may nonetheless create a $V_{MINSELECT}$ problem. Embodiments of the present invention quench this induced bounce in these wordlines as well. To accomplish this, quench diodes to the next to adjacent wordlines are of the same grouping (i.e., Even or Odd) as the wordline actually being selected. For this reason, the Even Quench Diodes are further grouped such that every other Even Quench Diode is in one of two sub-groups (i.e., the Even-even sub group 210, 222 and the Even-odd sub-group 212, 224) and the Odd Quench Diodes are further grouped such that every other Odd Quench Diode is in one of two sub-groups (i.e., the Odd-even sub-group 211, 223 and the Odd-odd sub-group 213, 225). Since any wordline to be selected will be connected to a quench signal in either the Even main group or in the Odd main group, the immediately adjacent wordlines may be quenched by asserting the Quench Diodes in the opposite main group. Furthermore, since the main quench group to which the selected wordline is connected will also be a member of either an even sub-group or an odd sub-group, the next to adjacent wordlines may be quenched by asserting the Quench Diodes in the opposite sub-group of the same main group. For example, referring still to FIG. 2, if WL1 (which is in the Odd-even group) were selected, the immediately surrounding lines, WL0 and WL2, may be quenched by way of the Even main group by switching on both left NMOS 234, 236, respectively; the next to adjacent wordlines, WL3, are also quenched by switching on the NMOS 235 of the same main group but opposite sub group; the Odd-even quench driver NMOS 237 typically remains off so as not to provide a path to ground from the selected wordline WL1 through quench diode 211. Note that any residual coupled signal to the next to next to adjacent wordlines will be quenched along with the adjacent wordlines by the Quench Diodes in the opposite main group; this will result in the three closest wordlines on either side of the selected wordline being quenched, where being quenched means bouncing up to a voltage no greater than the forward voltage drop of the quench diodes, $V_f$, above ground before falling back as the coupling bounce subsides.

Just as this positive bounce may create a potential problem on the wordlines, the bitlines may experience a potential negative-going bounce on the bitlines adjacent to the selected bitline and, depending on the geometry of the array and the switching speed and the amplitude of the drive signal on the selected bitline, on the bitlines next further out from the adjacent bitlines. These bitlines may be controlled using the same approach to quenching as was described above for the wordlines, but with opposite polarity voltages and with the direction of the diodes reversed. For example, if BL2 (which is in the Even-odd bitline group) were selected (i.e., connected to ground through an NMOS 280), the immediately surrounding lines, BL1 and BL3, may be quenched by applying a positive voltage to the two common wires 274, 276 of the Odd main bitline group; the next to adjacent bitlines, BL0 and BL4, are also quenched by applying a positive voltage to the common wire 270 of the same main group but opposite sub group; the Even-odd common wire 272 typically remains floating or at ground so as not to provide a path to a positive voltage source from the selected (i.e., pulled to ground) bitline BL2 through quench diode 242.

Depending on the geometry of the array and the switching speed and the amplitude of the drive signal on the selected wordline and bitline, the above approach to controlling coupled voltages on adjacent wordlines and bitlines may be mixed and matched. For example, the wordlines may only have their immediately adjacent lines quenched while the bitlines may have the adjacent three lines on both sides quenched or none quenched, and vice versa. Alternatively, the same grouping and sub-grouping of the quench lines may be extended to an additional level of grouping, allowing for more than three lines on both sides of a selected line to be quenched.

As shown in FIG. 2, each memory cell location may include or consist essentially of an array diode and an information storage element (e.g., a phase-change material such as a chalcogenide material like germanium-antimony-tellurium (GST)).

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of selecting a memory cell location within a cross-point memory array, the memory array comprising a plurality of wordlines intersecting a plurality of bitlines, each memory cell location being proximate a point of intersection between a wordline and a bitline, each wordline being electrically coupled to a driver device and a quench switch for minimizing parasitic coupling with adjacent wordlines, wherein the quench switch comprises a quench diode, the method comprising:
   selecting a first wordline, the first wordline being disposed between a second wordline and a third wordline;
   activating the quench switches coupled to the second wordline and the third wordline, thereby reducing parasitic coupling within the second and third wordlines resulting from selection of the first wordline; and
   selecting the first bitline, thereby selecting the memory cell disposed at the point of intersection between the first wordline and the first bitline.

2. The method of claim 1, wherein (i) selecting the first wordline comprises applying a first voltage thereto and (ii) activating the quench switches electrically coupled to the second and third wordlines comprises electrically connecting the second and third wordlines to a second voltage through the quench switches.

3. The method of claim 1, wherein the first voltage is a positive voltage and the second voltage is a ground voltage.

4. The method of claim 1, wherein at least one of the quench switches additionally comprises a transistor.

5. The method of claim 1, wherein (i) the plurality of wordlines comprises a plurality of odd wordlines interleaved with a plurality of even wordlines, (ii) the quench switches of the odd wordlines are electrically connected together, and (iii) the quench switches of the even wordlines are electrically connected together.

6. The method of claim 1, wherein (i) the plurality of wordlines comprises a plurality of odd wordlines interleaved with a plurality of even wordlines, (ii) a first plurality of odd wordlines comprises every other odd wordline, (iii) a second plurality of odd wordlines comprises the odd wordlines not within the first plurality of odd wordlines, (iv) a first plurality of even wordlines comprises every other even wordline, (v) a second plurality of even wordlines comprises the even wordlines not within the first plurality of even wordlines, (vi) the quench switches of the first plurality of odd wordlines are electrically connected together, (vii) the quench switches of the second plurality of odd wordlines are electrically connected together, (viii) the quench switches of the first plurality of even wordlines are electrically connected together, and (ix) the quench switches of the second plurality of even wordlines are electrically connected together.

7. The method of claim 6, further comprising:
   (a) if the first wordline is within the first plurality of odd wordlines, activating the quench switches electrically coupled to the second plurality of odd wordlines, thereby reducing parasitic coupling within the second plurality of odd wordlines resulting from selection of the first wordline;
   (b) if the first wordline is within the second plurality of odd wordlines, activating the quench switches electrically coupled to the first plurality of odd wordlines, thereby reducing parasitic coupling within the first plurality of odd wordlines resulting from selection of the first wordline;

(c) if the first wordline is within the first plurality of even wordlines, activating the quench switches electrically coupled to the second plurality of even wordlines, thereby reducing parasitic coupling within the second plurality of even wordlines resulting from selection of the first wordline; and (d) if the first wordline is within the second plurality of even wordlines, activating the quench switches electrically coupled to the first plurality of even wordlines, thereby reducing parasitic coupling within the first plurality of even wordlines resulting from selection of the first wordline.

8. The method of claim 7, wherein (i) selecting the first wordline comprises applying a first voltage thereto, (ii) activating the quench switches electrically coupled to the second and third wordlines comprises electrically connecting the second and third wordlines to a second voltage through the quench switches, and (iii) activating the quench switches electrically coupled to the first plurality of odd wordlines, the second plurality of odd wordlines, the first plurality of even wordlines, or the second plurality of even wordlines comprises electrically connecting said wordlines to a third voltage through the quench switches.

9. The method of claim 8, wherein (i) the second and third voltages are approximately equal and (ii) the first voltage is different from the second and third voltages.

10. A method of selecting a memory cell location within a cross-point memory array, the memory array comprising a plurality of wordlines intersecting a plurality of bitlines, each memory cell location being proximate a point of intersection between a wordline and a bitline, each wordline being electrically coupled to a driver device and a quench switch for minimizing parasitic coupling with adjacent wordlines, the method comprising:

selecting a first wordline, the first wordline being disposed between a second wordline and a third wordline;

activating the quench switches coupled to the second wordline and the third wordline, thereby reducing parasitic coupling within the second and third wordlines resulting from selection of the first wordline; and selecting the first bitline, thereby selecting the memory cell disposed at the point of intersection between the first wordline and the first bitline wherein each wordline comprises a first end electrically connected to a first quench switch and a second end, opposite the first end, electrically connected to a second quench switch.

11. A memory device comprising:
a plurality of wordlines;
a plurality of bitlines intersecting the plurality of wordlines;
a plurality of memory cell locations each disposed proximate a point of intersection between a wordline and a bitline;
a plurality of quench switches, each quench switch being electrically connected to a wordline, wherein the quench switches comprise a quench diode; and
a plurality of driver devices, each driver device being electrically connected to a wordline,
wherein, when a wordline is selected, activation of the quench switches electrically connected to wordlines proximate the selected wordline reduces or substantially eliminates parasitic coupling within the wordlines proximate the selected wordline.

12. The memory device of claim 11, wherein each quench switch additionally comprises a transistor.

13. The memory device of claim 11, wherein (i) the plurality of wordlines comprises a plurality of odd wordlines interleaved with a plurality of even wordlines, (ii) the quench switches of the odd wordlines are electrically connected together, and (iii) the quench switches of the even wordlines are electrically connected together.

14. A memory device comprising:
a plurality of wordlines;
a plurality of bitlines intersecting the plurality of wordlines;
a plurality of memory cell locations each disposed proximate a point of intersection between a wordline and a bitline;
a plurality of quench switches, each quench switch being electrically connected to a wordline; and
a plurality of driver devices, each driver device being electrically connected to a wordline,
wherein, when a wordline is selected, activation of the quench switches electrically connected to wordlines proximate the selected wordline reduces or substantially eliminates parasitic coupling within the wordlines proximate the selected wordline, wherein each wordline comprises a first end electrically connected to a first quench switch and a second end, opposite the first end, electrically connected to a second quench switch.

15. The memory device of claim 11, wherein (i) the plurality of wordlines comprises a plurality of odd wordlines interleaved with a plurality of even wordlines, (ii) a first plurality of odd wordlines comprises every other odd wordline, (iii) a second plurality of odd wordlines comprises the odd wordlines not within the first plurality of odd wordlines, (iv) a first plurality of even wordlines comprises every other wordline, (v) a second plurality of even wordlines comprises the even wordlines not within the first plurality of even wordlines, (vi) the quench switches of the first plurality of odd wordlines are electrically connected together, (vii) the quench switches of the second plurality of odd wordlines are electrically connected together, (viii) the quench switches of the first plurality of even wordlines are electrically connected together, and (ix) the quench switches of the second plurality of even wordlines are electrically connected together.

* * * * *